United States Patent
Risaki et al.

(10) Patent No.: US 7,888,212 B2
(45) Date of Patent: Feb. 15, 2011

(54) SEMICONDUCTOR DEVICE AND METHOD OF MANUFACTURING THE SAME

(75) Inventors: Tomomitsu Risaki, Chiba (JP); Yuichiro Kitajima, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/392,450

(22) Filed: Feb. 25, 2009

(65) Prior Publication Data
US 2009/0212375 A1 Aug. 27, 2009

(30) Foreign Application Priority Data
Feb. 26, 2008 (JP) ............................... 2008-044393

(51) Int. Cl.
*H01L 21/336* (2006.01)
(52) U.S. Cl. .................. 438/268; 438/270; 438/301; 438/305; 257/330; 257/341
(58) Field of Classification Search .................. 438/268, 438/270, 300–301, 305; 257/330, 341, E21.433, 257/E29.266
See application file for complete search history.

(56) References Cited

U.S. PATENT DOCUMENTS 6,124,611 A * 9/2000 Mori .......................... 257/330
2006/0223253 A1 10/2006 Risaki

* cited by examiner

*Primary Examiner*—Theresa T Doan
(74) *Attorney, Agent, or Firm*—Brinks Hofer Gilson & Lione

(57) ABSTRACT

In a well region, an irregular structure is formed in a gate width direction, and a gate electrode is formed in concave portions and on top surfaces of convex portions via an insulating film. Upper and lower source regions are formed on one side of the gate electrode in a gate length direction, and upper and lower drain regions are formed on the other side thereof. By thus forming the lower source and drain regions in the source and drain regions, current concentration occurring in an upper portion of a channel region, which is generated as the gate length becomes shorter, may be suppressed and a current may be allowed to flow uniformly in the entire channel region, and hence an effective gate width is made wider owing to the irregular structure formed in the well region. Accordingly, an on-resistance of a semiconductor device is reduced to enhance driving performance.

2 Claims, 5 Drawing Sheets

SEMICONDUCTOR DEVICE AND METHOD OF MANUFACTURING THE SAME

RELATED APPLICATIONS

This application claims priority under 35 U.S.C. §119 to Japanese Patent Application No. JP2008-044393 filed on Feb. 26, 2008, the entire content of which is hereby incorporated by reference.

BACKGROUND OF THE INVENTION

1. Field of the Invention

The present invention relates to a semiconductor device and a method of manufacturing the semiconductor device, and more specifically, to a metal oxide semiconductor (MOS) transistor having a wide gate width with use of a trench.

2. Description of the Related Art

A MOS transistor is an electronic device at the core of electronic technology, and hence downsizing and driving performance enhancement of the MOS transistor are important issues. As a method of enhancing the driving performance of the MOS transistor, there is given a method involving making a gate width longer, to thereby decrease the on-resistance. However, when the gate width is made longer, there arises a problem in that an occupation area of the MOS transistor becomes larger.

JP 2006-294645 A proposes a technology in which the gate width is made longer while suppressing an increase of the occupation area of the MOS transistor having a lateral MOS structure. In this technology, as illustrated in a perspective view of FIG. 2A, concave portions (trenches) 11a are formed in a well 2, and a gate electrode 3 is formed on convex portions 11b and in the concave portions 11a via a gate insulating film 4. In a surface portion of the well 2, a source region 5a is formed on one side of the gate electrode 3, and a drain region 6a is formed on the other side thereof.

An A-A sectional view and a B-B sectional view of FIG. 2A are illustrated in FIG. 2B and FIG. 2C, respectively. As illustrated in the A-A sectional view, the gate electrode 3 is formed in the concave portions 11a, and hence a length of an outline which is brought into contact with the gate insulating film 4 becomes a gate width. In this way, according to this technology, a length of an effective gate width may be made longer than a length of the gate electrode 3 on a surface of a gate portion by forming the gate portion in a trench structure having the concave portions 11a and the convex portions 11b, whereby an on-resistance per unit area may be reduced without reducing a withstanding voltage of the MOS transistor.

In this technology, as illustrated in the perspective view of FIG. 2A, the trenches are formed in the well 2 to form the concave portions 11a and the convex portions 11b, and the gate electrode 3 is formed on top surfaces of the convex portions 11b and in the concave portions 11a via the gate insulating film 4. In the surface portion of the well 2, the source region 5a is formed on one side of the gate electrode 3, and the drain region 6a is formed on the other side thereof.

FIG. 2B is the A-A sectional view of FIG. 2A, in which a channel region 9 is formed along the concave portions 11a and the convex portions 11b by applying a voltage to the gate electrode 3, and a gate width may be made longer by a length of side surfaces of the concave portions compared with a general MOS transistor in which a trench is not formed, whereby the on-resistance per unit area may be reduced without reducing the withstanding voltage of the MOS transistor.

However, in the structure of FIG. 2A, there arises a problem in that expected driving performance cannot be obtained as the gate length L becomes shorter.

FIG. 2C is the B-B sectional view of FIG. 2A. As apparent from FIG. 2B, FIG. 2C is a sectional view obtained by cutting a portion immediately next to a side wall of the trench, in which the channel region 9 is formed. Current flows via current paths 10 into the channel region 9 formed between the source and the drain, which is illustrated in FIG. 2C. The current path 10 located in an upper portion of the channel region 9 is shorter than the current path 10 located in a lower portion of the channel region 9, and this difference is markedly observed as the gate length L becomes shorter. Specifically, as the gate length L becomes shorter, a current flows through the current path 10 located in the upper portion of the channel region 9 in a concentrated manner. This results in a phenomenon in which a current hardly flows through the current path 10 located in the lower portion. Thus, the channel region 9 cannot be used effectively, and as a result, expected driving performance cannot be obtained. This may be because the source region 5a and the drain region 6a have a depth shallower than that of the trench. When the depth of the source region 5a and the drain region 6a may be made almost equal to the trench depth, the above-mentioned current concentration does not occur even with the shorter gate length L, and current flows uniformly in the entire channel. However, as to the source region and drain region to which a normal impurity implantation is applied, even when the source region and the drain region are deeply formed, it is generally difficult to form them with a depth larger than 0.5 μm.

Through thermal diffusion after the impurity implantation, the impurities can be diffused to a deeper level. However, the diffusion lowers the concentration of the source and drain regions, and causes an increase of a parasitic resistance and deterioration of the driving performance. In addition, the impurities diffuse not only in a depth direction but also in a lateral direction, and hence an effective length L becomes shorter. In order to attain a target effective length L, a length L of a layout has to be made larger by an amount for the lateral-direction diffusion, and as a result, a size of the device increases and the driving performance per unit area deteriorates.

As another method, exceptionally large implantation energy can be used to diffuse the impurities deeper. Similarly to the above-mentioned method, also in this method, lateral-direction diffusion of the impurities deteriorates the driving performance per unit area. Further, the increased implantation energy causes a risk that the impurities penetrate a gate electrode to be implanted into the channel.

SUMMARY OF THE INVENTION

It is an object of the present invention to enhance driving performance per unit area of a semiconductor device having a trench structure.

(1) In order to achieve the above-mentioned object, the present invention provides a semiconductor device including: a semiconductor substrate; a first conductivity type well region formed on the semiconductor substrate and having irregularities formed therein in a gate width direction; a gate electrode formed in the irregularities via an insulating film; a second conductivity type upper source region formed on one side of the gate electrode in an irregular longitudinal direction, in a vicinity of an upper portion of the first conductivity type well region; a second conductivity type lower source region formed on a lower side of the second conductivity type upper source region to be made shallower than the first conductivity type well region; a second conductivity type upper drain region formed on another side of the gate electrode in the irregular longitudinal direction, in the vicinity of the upper portion of the first conductivity type well region; and a second conductivity type lower drain region formed on a lower side of the second conductivity type upper drain region so as to be made shallower than the first conductivity type well region.

(2) In the above-mentioned semiconductor device, regions of the second conductivity type upper drain region and the second conductivity type lower drain region, which are adjacent to the gate electrode, are set to have low impurity concentration.

(3) There is also provided a method of manufacturing a semiconductor device, including: forming a first conductivity type lower well region on a semiconductor substrate; forming a second conductivity type lower source region and a second conductivity type lower drain region in a part of the first conductivity type lower well region; forming a semiconductor epitaxial layer on a substrate surface of the first conductivity type lower well region, a substrate surface of the second conductivity type lower source region, and a substrate surface of the second conductivity type lower drain region; forming an upper well region on the semiconductor epitaxial layer; forming a trench for forming irregularities by etching; forming an insulating film on an entire surface of the irregularities, and forming a gate electrode via the insulating film; and performing ion implantation on both sides of the formed gate electrode and forming an upper source region and an upper drain region so as to be brought into contact with the second conductivity type lower source region and the second conductivity type lower drain region.

(4) Further, there is provided a method of manufacturing a semiconductor device, including: forming a first conductivity type lower well region on a semiconductor substrate; forming a second conductivity type lower low-concentration source region and a second conductivity type lower low-concentration drain region in a part of the first conductivity type lower well region; forming a second conductivity type lower source region and a second conductivity type lower drain region in a part of the first conductivity type lower well region, the second conductivity type lower source region and the second conductivity type lower drain region having higher impurity concentration than the second conductivity type lower low-concentration source region and the second conductivity type lower low-concentration drain region; forming a semiconductor epitaxial layer on a substrate surface of the first conductivity type lower well region, a substrate surface of the second conductivity type lower source region, and a substrate surface of the second conductivity type lower drain region; forming an upper well region on the semiconductor epitaxial layer; forming a trench for forming irregularities by etching; forming an insulating film on an entire surface of the irregularities, and forming a gate electrode via the insulating film; performing ion implantation on both sides of the gate electrode and forming a second conductivity type upper low-concentration region; and forming a second conductivity type upper source region and a second conductivity type upper drain region on a source side of the gate electrode and on a part of a drain side of the gate electrode, the second conductivity type upper source region and the second conductivity type upper drain region having higher impurity concentration than the second conductivity type upper low-concentration region.

According to the present invention, the driving performance of the semiconductor device may be enhanced by forming the source region and the drain region deeper compared with the related art.

DETAILED DESCRIPTION OF THE PREFERRED EMBODIMENTS (1) Outline of Embodiment

Figure 1A:
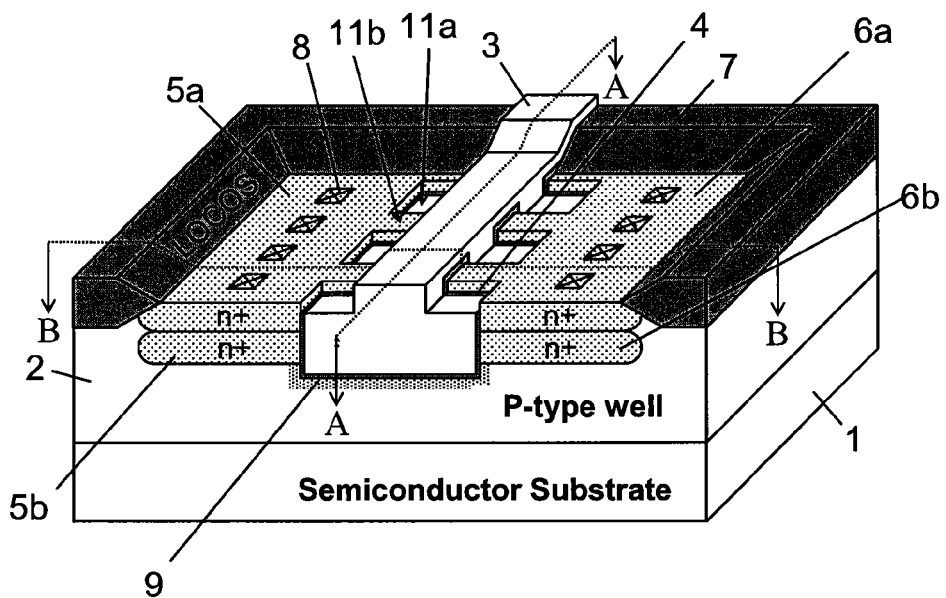
FIGS. 1A to 1C are views for describing a structure of a semiconductor device according to an embodiment of the present invention.
Figure 1B:
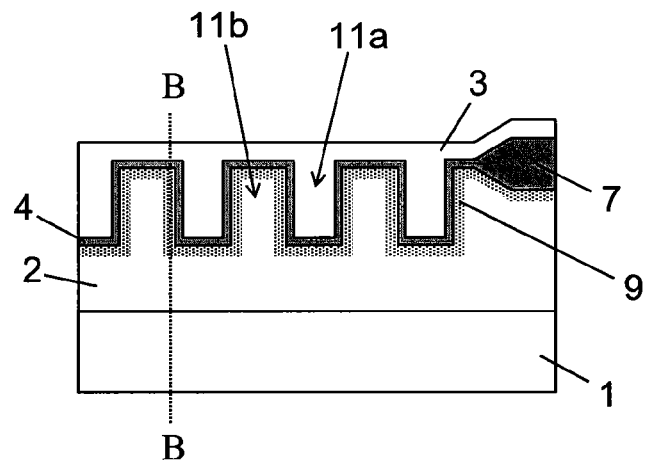
Figure 1C:
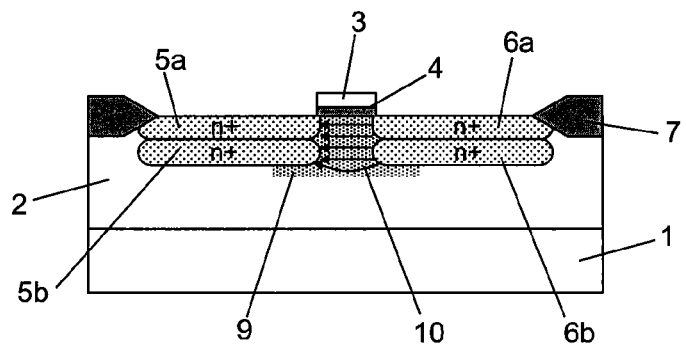

FIGS. 1A to 1C illustrate a structure of a semiconductor device according to an embodiment of the present invention. FIG. 1A is a perspective view, FIG. 1B is an A-A sectional view of FIG. 1A, and FIG. 1C is a B-B sectional view of FIG. 1A.

In a well region 2, an irregular structure (concave portions 11a and convex portions 11b) is formed in a gate width direction, and a gate electrode 3 is formed in the concave portions 11a and on top surfaces of the convex portions 11b via an insulating film 4. An upper source region 5a and a lower source region 5b are formed on one side of the gate electrode 3 in a gate length direction, and an upper drain region 6a and a lower drain region 6b are formed on the other side thereof. In this way, through the formation of the lower source region 5b and the lower drain region 6b in the source region and the drain region, current concentration, which is generated as the a length L becomes shorter, in an upper portion of a channel region 9 of FIG. 1C may be suppressed and a current may be allowed to flow uniformly in the entire channel region 9, whereby the driving performance is enhanced.

(2) Details of Embodiment

FIGS. 1A to 1C are views for describing the structure of the semiconductor device according to the embodiment of the present invention.

The present invention provides a MOS transistor having a lateral MOS structure, in which the well region 2 is formed on a semiconductor substrate 1 and further, the gate electrode 3, the upper source region 5a, the lower source region 5b, the upper drain region 6a, and the lower drain region 6b are formed on the well region 2. Those components are electrically isolated from other regions of the semiconductor substrate 1 by a local oxidation of silicon (LOCOS) 7. The well region 2 is formed to have a first conductivity type, and the upper source region 5a, the lower source region 5b, the upper drain region 6a, and the lower drain region 6b are formed to have a second conductivity type. When the first conductivity is p-type, the second conductivity is n-type, and when the first conductivity is n-type, the second conductivity is p-type.

In FIGS. 1A to 1C, the first conductivity is p-type and the second conductivity is n-type, the well region 2 is formed of a p-type semiconductor, and the source region 5 and the drain region 6 are formed of an n-type semiconductor. In FIGS. 1A to 1C, for a clear distinction between the p-type and the n-type, the well region of p-type is referred to as "p-type well region". Further, in FIGS. 1A to 1C, similar description may be made also in a case where the first conductivity is n-type and the second conductivity is p-type, the well region 2 is formed of an n-type semiconductor, and the upper source region 5a, the lower source region 5b, the upper drain region 6a, and the lower drain region 6b are formed of a p-type semiconductor.

Figure 2A:
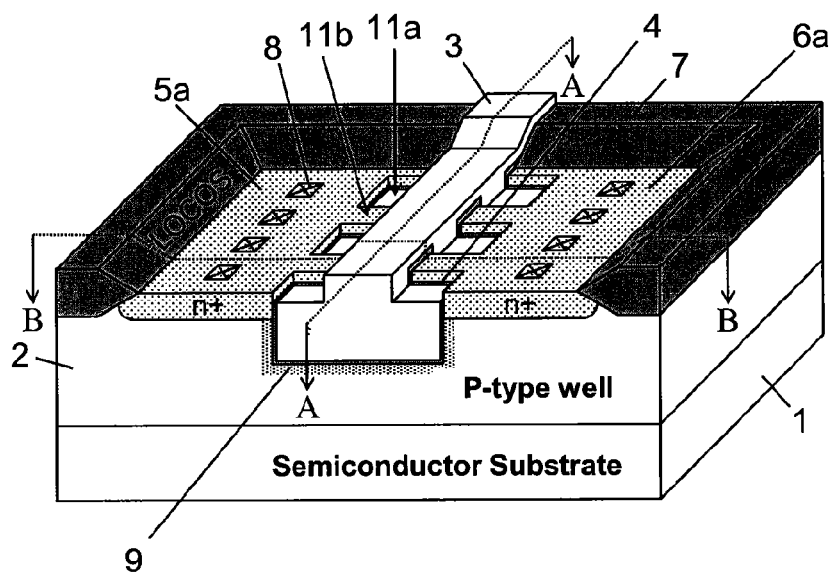
FIGS. 2A to 2C are views for describing a conventional semiconductor device.
Figure 2B:
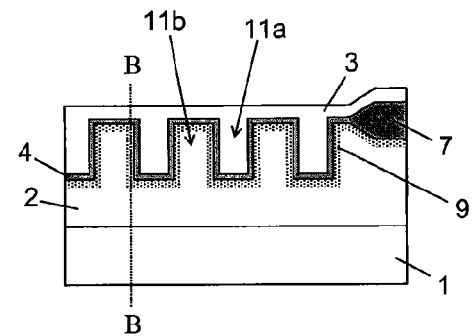
Figure 2C:
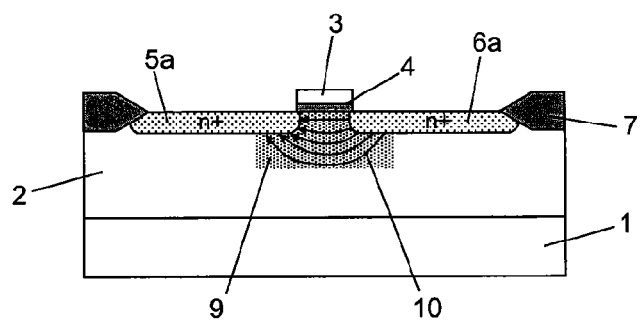

A plurality of trenches, i.e., the concave portions 11a is formed in the well region 2 to be arranged in the gate width direction. The insulating film 4 made of $SiO_2$ is formed on an inner surface side of the concave portions 11a and a top surface side of the convex portions 11b, i.e., on a surface on which the gate electrode 3 is opposed to the well region 2. The gate electrode 3 made of polycrystalline silicon or the like is formed on the inner surfaces of the concave portions 11a and on the top surfaces of the convex portions 11b via the insulating film 4. This structure including those concave portions 11a, the convex portions 11b, the insulating film 4, and the gate electrode 3 is similar to a conventional example illustrated in FIGS. 2A to 2C.

In side surface regions of the gate electrode 3 in the gate length direction, on one side thereof, the upper source region 5a and the lower source region 5b formed of the n-type semiconductor are formed. On the other side thereof, the upper drain region 6a and the lower drain region 6b formed of the n-type semiconductor are formed. Through the formation of the lower source region 5b and the lower drain region 6b, a depth of the source and drain regions is made larger compared with the case of a structure having only the upper source region 5a and the upper drain region 6a. A plurality of contacts 8 are formed in the upper source region 5a and the upper drain region 6a, whereby bonding with an external circuit may be performed. Symbol "n+" of in FIGS. 1A and 1C represents that a concentration of the n-type is high (i.e., impurities are highly concentrated). In a case of low concentration, symbol "n–" is used.

As described above, through the formation of the lower source region 5b and the lower drain region 6b respectively in the source region and the drain region, the current concentration, which is generated as the gate length L becomes shorter, in the upper portion of the channel region 9 of FIG. 1C may be suppressed and a current may be allowed to flow uniformly in the entire channel region 9, whereby the driving performance is enhanced. With this structure, the driving performance may be enhanced while suppressing an increase of an occupation area of the semiconductor device of the present invention.

Next, description is made on a method of manufacturing the semiconductor device of FIGS. 1A to 1C.

Figure 3A:
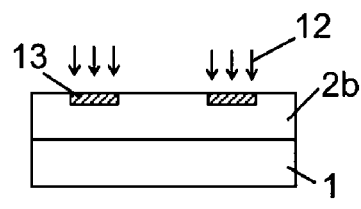
FIGS. 3A to 3F are views for describing a method of manufacturing the semiconductor device of FIGS. 1A to 1C.
Figure 3B:
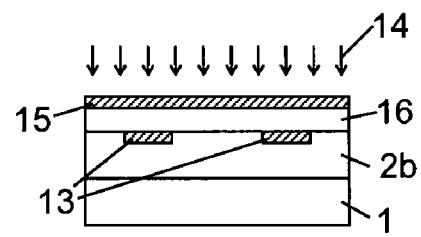

In order to manufacture the semiconductor device of FIGS. 1A to 1C, first, as illustrated in FIG. 3A, a first conductivity type lower well region 2b is formed on the semiconductor substrate 1. After that, a mask is formed by a resist or the like, impurity implantation 12 for lower source and drain is performed in an arbitrary portion, and a second conductivity type impurity region 13 is formed in the lower well region 2b. Then, as illustrated in FIG. 3B, a semiconductor epitaxial layer 16 is grown on a substrate surface, and impurity implantation 14 for an upper well is performed on a surface of the semiconductor epitaxial layer 16 to thereby form a first conductivity type impurity region 15.

Figure 3C:
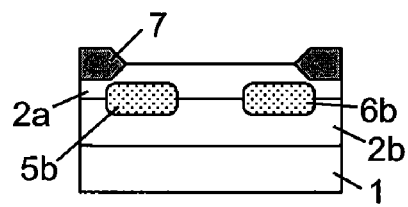

As illustrated in FIG. 3C, the LOCOS 7 is formed and impurities in the impurity region 13 for the lower source and drain and in the impurity region 15 for the upper well are diffused, to thereby form the lower source region 5b, the lower drain region 6b, and an upper well region 2a. In this case, a dose of the impurity implantation 12 for lower source and drain is made extremely larger than a dose of the impurity implantation 14 for an upper well so that the lower source region 5b and the lower drain region 6b are not extinguished by the upper well region 2a. Further, the dose of the impurity implantation 14 for an upper well is adjusted so that a concentration of the upper well region 2a is made substantially equal to that of the lower well region 2b. Moreover, a thickness of the semiconductor epitaxial layer 16 is also adjusted so that the upper well region 2a is brought into contact with the lower well region 2b.

Figure 3D:
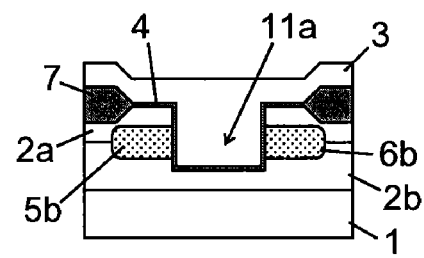
Figure 3E:
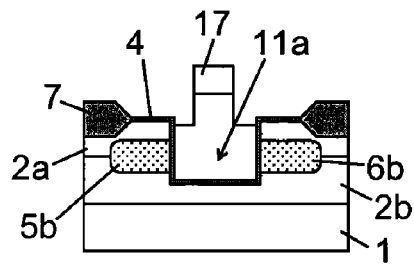
Figure 3F:
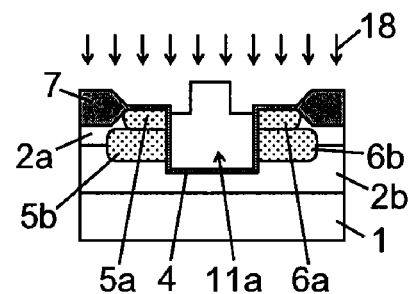

As illustrated in FIG. 3D, a trench 11a is formed and thereafter, the gate insulating film 4 is formed and the gate electrode 3 is formed on the gate insulating film 4. In this case, the gate electrode 3 is formed so as to fill the trench 11a. Next, as illustrated in FIG. 3E, a mask is selectively formed with a resist to etch the gate electrode 3. Finally, as illustrated in FIG. 3F, impurity implantation 18 for upper source and drain is performed to form the upper source region 5a and the upper drain region 6a of the second conductivity type by self-aligning.

In this case, the thickness of the epitaxial layer, and a dose and energy of the impurity implantation 18 for upper source and drain are adjusted so that the upper source region 5a and the upper drain region 6a are brought into contact with the lower source region 5b and the lower drain region 6b, respectively.

According to this embodiment described above, the following effects may be obtained.

(1) The gate electrode 3 is formed in the concave portions 11a and on the convex portions 11b to be brought into contact with the irregular structure, which allows formation of the channel 9 having the irregular structure and allows an effective gate width to be wider.

(2) Through the formation of the lower source region 5b and the lower drain region 6b in the source region and the drain region, the current concentration, which is generated as the gate length L becomes shorter, in the upper portion of the channel region 9 of FIG. 1C may be suppressed and a current may be allowed to flow uniformly in the entire channel region 9, which allows the channel to be used effectively.

(3) The effective gate width is made larger, and hence an on-resistance is reduced. Accordingly, the driving performance of the semiconductor device 1 may be enhanced.

(4) A complementary metal oxide semiconductor (CMOS) structure having high driving performance in one chip may be formed.

Note that, in FIGS. 1A to 1C, the first conductivity type is p-type and the second conductivity is n-type, whereby the n-channel MOS transistor is obtained. When the first conductivity type is n-type and the second conductivity is p-type, the MOS transistor functions as a p-channel MOS transistor.

(Modification 1)

In this modification, a withstanding voltage of a semiconductor device is enhanced through formation of an electric field relaxation region in a drain region.

Figure 4:
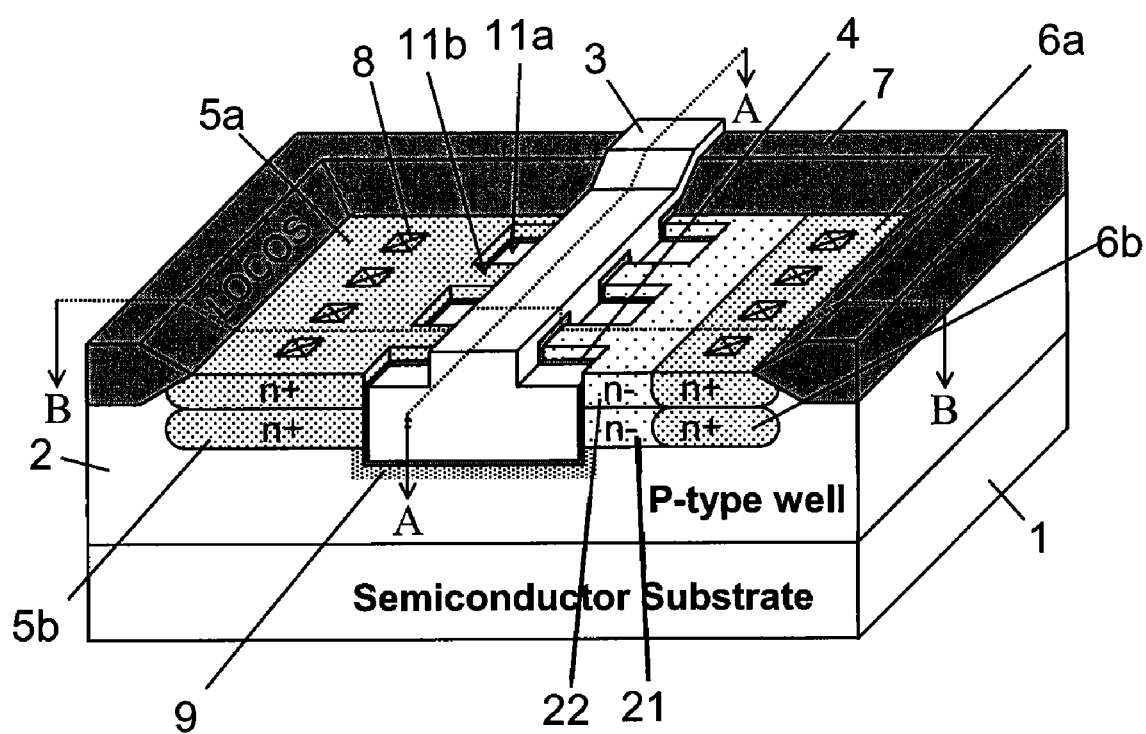
FIG. 4 is a view for describing a structure of a semiconductor device according to Modification 1.

FIG. 4 is a view for describing a structure of a semiconductor device according to this modification.

In the drain regions 6a and 6b of the above-mentioned semiconductor device of FIGS. 1A to 1C, there are formed a lower low-concentration drain region 21 and an upper low-concentration drain region 22, which are n-regions having low concentration of n-type, on a side opposed to the gate electrode 3. N+ drain regions 6a and 6b have a high concentration of the n-type, which is substantially equal to the concentration of the drain regions 6a and 6b of FIGS. 1A to 1C, and contacts 8 are formed on the n+ drain regions 6a and 6b. On the other hand, a structure on a source side is the same as in FIGS. 1A to 1C. As described above, when the region having a low concentration of the n-type between the gate electrode 3 and the n+ drain regions 6a and 6b, an electric field is relaxed in this region and a withstanding voltage of the semiconductor device illustrated in FIG. 4 is enhanced.

Figure 5A:
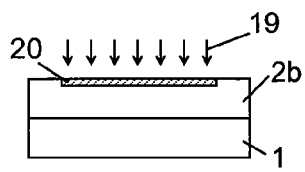
FIGS. 5A to 5I are views for describing a method of manufacturing the semiconductor device of FIG. 4.
Figure 5B:
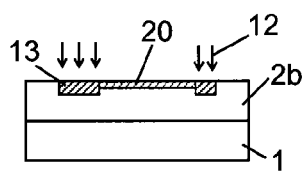
Figure 5C:
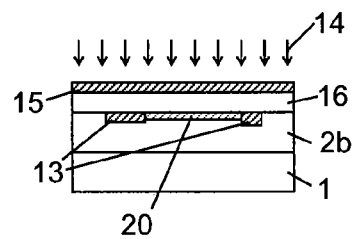
Figure 5D:
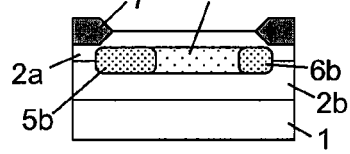
Figure 5E:
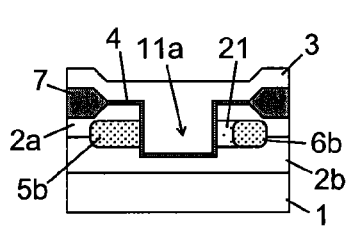
Figure 5F:
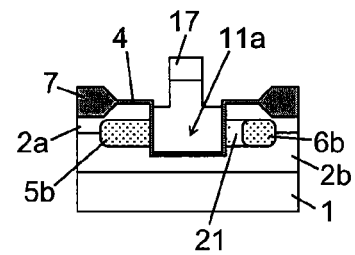
Figure 5G:
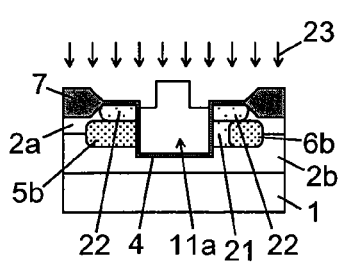
Figure 5H:
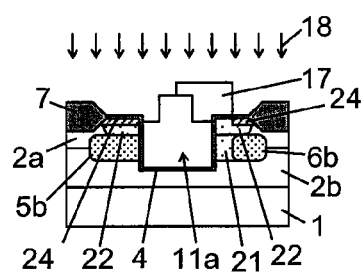
Figure 5I:
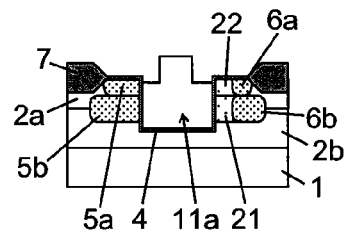

Next, a method of manufacturing the semiconductor device of FIG. 4 is described. FIGS. 5A to 5I illustrate the method of manufacturing the semiconductor device of FIG. 4, and a basic manufacturing method is the same as in FIGS. 3A to 3F which illustrate the method of manufacturing the semiconductor device of FIGS. 1A to 1C. FIGS. 5A to 5I are different from FIGS. 3A to 3F in the following point: impurity implantation 19 for a lower low-concentration region 20 of FIG. 5A and impurity implantation 23 for an upper low-concentration drain 22 of FIG. 5G are added, and as illustrated in FIG. 5H, a resist mask 17 is formed so that the upper low-concentration drain region 22 is not extinguished by the upper drain region 6a. Through this method, the low-concentration drain regions are formed, and therefore the withstanding voltage of the semiconductor device of FIG. 4 is enhanced.

What is claimed is:

1. A method of manufacturing a semiconductor device, comprising:

forming a first conductivity type lower well region on a semiconductor substrate;

forming a second conductivity type lower source region and a second conductivity type lower drain region in a part of the first conductivity type lower well region;

forming a semiconductor epitaxial layer on a substrate surface of the first conductivity type lower well region, a substrate surface of the second conductivity type lower source region, and a substrate surface of the second conductivity type lower drain region;

forming an upper well region on the semiconductor epitaxial layer;

forming a trench having a depth deeper than a depth of the lower source region and the lower drain region for forming a convex-concave portion by etching;

forming an insulating film on an entire surface of the convex-concave portion, and forming a gate electrode via the insulating film; and performing ion implantation on both sides of the gate electrode and forming an upper source region and an upper drain region in contact with the second conductivity type lower source region and the second conductivity type lower drain region, respectively.

2. A method of manufacturing a semiconductor device, comprising:

forming a first conductivity type lower well region on a semiconductor substrate;

forming a second conductivity type lower low-concentration region in a part of the first conductivity type lower well region;

forming a second conductivity type lower source region and a second conductivity type lower drain region in a part of the lower low-concentration region, the second conductivity type lower source region and the second conductivity type lower drain region having higher impurity concentration than lower low-concentration region;

forming a semiconductor epitaxial layer on a substrate surface of the first conductivity type lower well region, a substrate surface of the second conductivity type lower source region, and a substrate surface of the second conductivity type lower drain region;

forming an upper well region on the semiconductor epitaxial layer;

etching the semiconductor substrate to form a trench having a depth deeper than a depth of the lower source region and the lower drain region and forming a convex-concave portion;

forming an insulating film on an entire surface of the convex-concave portion, and forming a gate electrode via the insulating film;

performing ion implantation on both sides of the gate electrode and forming a second conductivity type upper low-concentration region in contact with the lower source region and the lower drain region, respectively; and forming a second conductivity type upper source region and a second conductivity type upper drain region on a source side of the gate electrode and on a part of a drain side of the gate electrode, the second conductivity type upper source region and the second conductivity type upper drain region having higher impurity concentration than the second conductivity type upper low-concentration region.

* * * * *